(12) United States Patent  (10) Patent No.: US 9,215,794 B2
Chen  (45) Date of Patent: Dec. 15, 2015

(54) CIRCUIT BOARD AND DISPLAY DEVICE

(71) Applicant: Shenzhen China Star Optoelectronics Technology Co., Ltd., Shenzhen, Guangdong (CN)

(72) Inventor: Yin-Hung Chen, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 107 days.

(21) Appl. No.: 13/983,059

(22) PCT Filed: Jun. 25, 2013

(86) PCT No.: PCT/CN2013/077845
§ 371 (c)(1),
(2) Date: Aug. 1, 2013

(87) PCT Pub. No.: WO2014/180030
PCT Pub. Date: Nov. 13, 2014

(65) Prior Publication Data
US 2014/0327607 A1  Nov. 6, 2014

(30) Foreign Application Priority Data

May 6, 2013 (CN) .......................... 2013 1 0168971

(51) Int. Cl.
*H05K 1/02* (2006.01)
*G09G 3/20* (2006.01)
*H05K 1/14* (2006.01)

(52) U.S. Cl.
CPC ............ *H05K 1/0209* (2013.01); *G09G 3/2092* (2013.01); *G09G 2300/0426* (2013.01); *G09G 2320/041* (2013.01); *H05K 1/147* (2013.01); *H05K 2201/10128* (2013.01); *H05K 2201/10136* (2013.01); *H05K 2201/10681* (2013.01)

(58) Field of Classification Search
CPC ............. G09G 3/3266–3/3291; G09G 3/3611; G09G 3/3622; G09G 3/3625; G09G 3/3648; G09G 3/3655; G09G 3/3674–3/3692; G09G 2300/0421; G09G 2300/0426; G09G 2320/04; G09G 2320/041; G09G 2330/04; G09G 2330/045; G09G 3/2092; H05K 1/0201–1/0212; H05K 1/0271; H05K 7/20436–7/205; H05K 2201/0364–2201/0385; H05K 2201/058; H05K 2201/06; H05K 2201/066; H05K 2201/10227; H05K 2201/10416; H05K 1/0209; H05K 1/147; H05K 2201/10128; H05K 2201/10136; H05K 2201/10681
See application file for complete search history.

(56) References Cited

U.S. PATENT DOCUMENTS

| | | | |
|---|---|---|---|
| 5,982,630 A * | 11/1999 | Bhatia ........................... | 361/767 |
| 2001/0011984 A1* | 8/2001 | Hong .............................. | 345/92 |
| 2004/0178983 A1* | 9/2004 | Tsai et al. ..................... | 345/100 |
| 2005/0259039 A1* | 11/2005 | Kim et al. ....................... | 345/60 |
| 2012/0107973 A1* | 5/2012 | Grotsch et al. ................. | 438/26 |

* cited by examiner

*Primary Examiner* — Nathan Danielsen

(57) ABSTRACT

A display device and a circuit board for it are provided. The circuit board includes a bare copper region which is positioned corresponding to a chip of a driver IC of the display device; the bare copper region resists the chip and is configured to conduct away the heat generated from the chip. The display device comprises a circuit board, a driver IC electrically connected to the circuit board and fixed on the circuit board, and a display screen electrically connected to the driver IC. The following advantageous effects can be achieved: the circuit board has a bare copper region resisting the chip of the driver IC, which can effectively conduct away the heat generated from the driver IC to make the heat-dissipating effect of the display device better, and thereby extending the lifetime of the display device.

8 Claims, 2 Drawing Sheets

CIRCUIT BOARD AND DISPLAY DEVICE

TECHNICAL FIELD

The present invention relates to the field of displaying technology, and more particularly, relates to a circuit board and a display device.

BACKGROUND

As shown in FIG. 1, the display device in the prior art generally comprises a circuit board 1, a driver IC 2 and a display screen 3, wherein the driver IC 2 is electrically connected to the circuit board 1, and the display screen 3 is electrically connected to the driver IC 2. Generally, the driver IC 2 includes at least a chip 21; the chip 21 is the component which produces more heat in the driver IC 2. According to the traditional way of assembly, each of the circuit board 1 and the display screen 3 is disposed on one side of the driver IC 2. In this case, the chip 21 of the driver IC 2 is suspended between the circuit board 1 and the display screen 3, so when the driver IC 2 is used, it only can dissipate the heat through the air which is used as the cooling medium. Therefore, the effect of the heat dissipation is poor.

BRIEF SUMMARY

Aiming at the drawbacks that the driver IC in the prior art has a poor heat-dissipating effect when it is used, the objective of the present invention is to provide a circuit board and a display device which can improve the heat-dissipating effect of the driver IC that is in use.

The technical solutions of the present invention for solving the technical problems are as follows:

A circuit board is provided, which is used for a display device, the circuit board includes a bare copper region which is positioned corresponding to a chip of a driver IC of the display device; the bare copper region and the chip resist each other, and the bare copper region is configured to conduct away the heat generated from the chip.

According to the circuit board of the present invention, the circuit board is an X-board PCB, the X-board PCB is positioned on the side in the longitudinal direction of the display screen of the display device.

According to the circuit board of the present invention, the bare copper region is disposed on the side of the circuit board which is close to the surface of the driver IC.

According to the circuit board of the present invention, the circuit board includes a first golden finger which is configured to make the circuit board electrically connected to the driver IC; the first golden finger is positioned in the centre of the circuit board.

According to the circuit board of the present invention, the dimension of the shadow which the bare copper region projects on the plane where the chip is positioned is larger than or equal to the dimension of the shadow which the chip projects on the plane where the bare copper region is positioned.

A display device is also provided in the present invention, which comprises a circuit board, a driver IC and a display screen; the driver IC is electrically connected to the circuit board and fixed on the circuit board; the display screen is electrically connected to the driver IC; the circuit board includes a are copper region which is positioned corresponding to a chip of a driver IC of the display device; the bare copper region and the chip resist each other, and the bare copper region is configured to conduct away the heat generated from the chip.

According to the display device of the present invention, the circuit board is an X-board PCB, the X-board PCB is positioned on the side in the longitudinal direction of the display screen of the display device.

According to the display device of the present invention, the bare copper region is disposed on the side of the circuit board which is close to the surface of the driver IC.

According to the display device of the present invention, the circuit board includes a first golden finger which is configured to make the circuit board electrically connected to the driver IC; the first golden finger is positioned in the centre of the circuit board.

According to the display device of the present invention, the dimension of the shadow which the bare copper region projects on the plane where the chip is positioned is larger than or equal to the dimension of the shadow which the chip projects on the plane where the bare copper region is positioned.

According to the display device of the present invention, the display screen is an LCD display screen or an OLED display screen.

According to the display device of the present invention, the display screen includes a second golden finger which is configured to make the display screen electrically connected to the driver IC; the second golden finger is positioned on one side of the display screen.

According to the display device of the present invention, the display device further includes a first COF baseband; the circuit board is electrically connected to the driver IC through the first COF baseband.

According to the display device of the present invention, the display device further includes a second COF baseband; the display screen is electrically connected to the driver IC through the second COF baseband.

When implementing the circuit board and the display device of the present invention, the following advantageous effects can be achieved: the circuit board has a bare copper region resisting the chip of the driver IC, which can effectively conduct away the heat generated from the driver IC to make the heat-dissipating effect of the display device better, and thereby extending the lifetime of the display device.

BRIEF DESCRIPTION OF THE DRAWINGS

The present invention will be further described with reference to the accompanying drawings and embodiments in the following, in the accompanying drawings.

DETAILED DESCRIPTION OF THE PREFERRED EMBODIMENT

In order to make the technical features, the objects and the technical effects of the present invention more clearly, the present invention will now be described in detail with reference to the accompanying drawings and embodiments.

Figure 1:
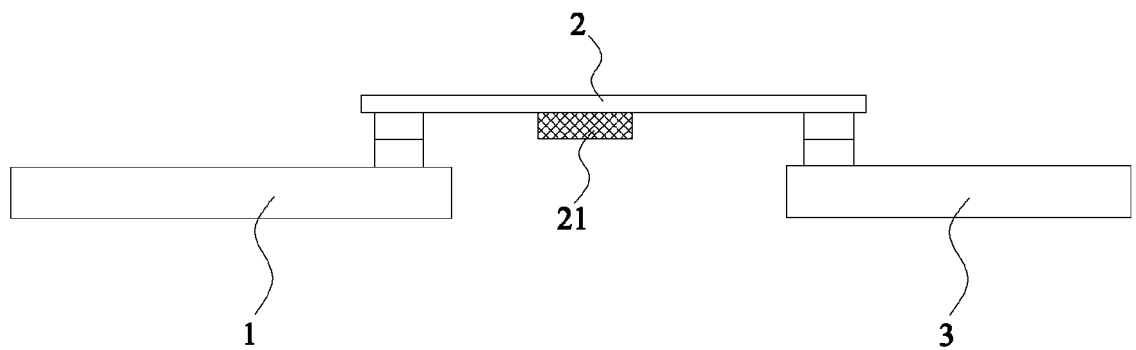
FIG. 1 is schematic view of a display device according to the prior art.
Figure 2:
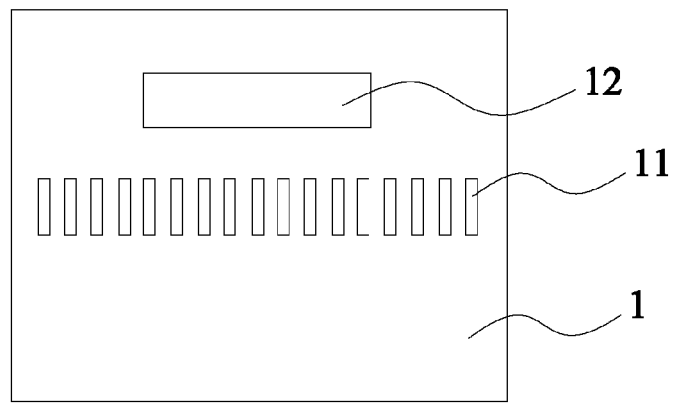
FIG. 2 is a schematic view of a circuit board according to a preferred embodiment of the present invention.
Figure 3:
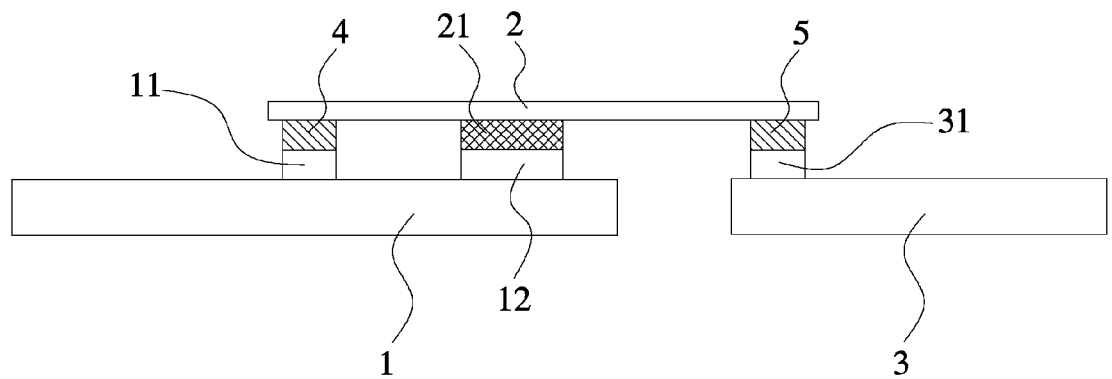
FIG. 3 is a schematic view of a display device according to the preferred embodiment of the present invention.

As shown in FIG. 2 and FIG. 3, a preferred embodiment of the present invention provides a circuit board, which is used for a display device. The circuit board 1 includes a bare copper region 12, which is positioned corresponding to a chip 21 of a driver IC 2 of the display device. The bare copper region 12 and the chip 21 resist each other. According to the prior art, the driver IC 2 includes at least one chip 21, the chip 21 is also called as the IC die, and is the component which produces more heat in the driver IC 2. Since the bare copper region 12 has a good heat-conductivity, and can rapidly conduct away the heat generated from the driver IC 2 in time, which makes the heat-dissipating effect of the driver IC 2 better, thereby its lifetime can be extended. Furthermore, since a bare copper region 12 is set in the circuit board 1, the heat-dissipating performance of the driver IC 2 can be improved without any extra heat-dissipating component added, and thus reducing the cost.

In the present embodiment, the circuit board 1 is an X-board PCB. The X-board PCB is also called as the horizontal substrate, and it is positioned on the side in the longitudinal direction of the display screen of the display device. A Y-board PCB is set corresponding to the X-board PCB and perpendicular to the X-board PCB. The Y-board PCB is also called the straight substrate, and it is positioned on the side in the width direction of the display screen of the display device. Referring to FIG. 2, the circuit board 1 includes a first golden finger 11 which is configured to make the circuit board 1 electrically connected to the driver IC 2. The first golden finger is positioned in the centre of the circuit board 1. It should be understood that, there are other options for the position of the first golden finger 11 relative to the circuit board 1, for example, the first golden finger 11 can be positioned on the lateral side of the circuit board 1.

In the present invention, the bare copper region 12 is disposed on the side of the circuit board 1 which is close to the surface of the driver IC 2. That is, the bare copper region 12 and the first golden finger 11 are positioned on the same side of the circuit board 1. The shape of the bare copper region 12 matches with the shape of the chip 21 on the whole. In order to make it convenient for the bare copper region 12 to be processed in the circuit board 1, in the present embodiment, the bare copper region 12 is square. It would be understood that, it is also possible for the bare copper region 12 to be designed into other shapes, such as circle, groove, and arc, etc.

Figure 4:
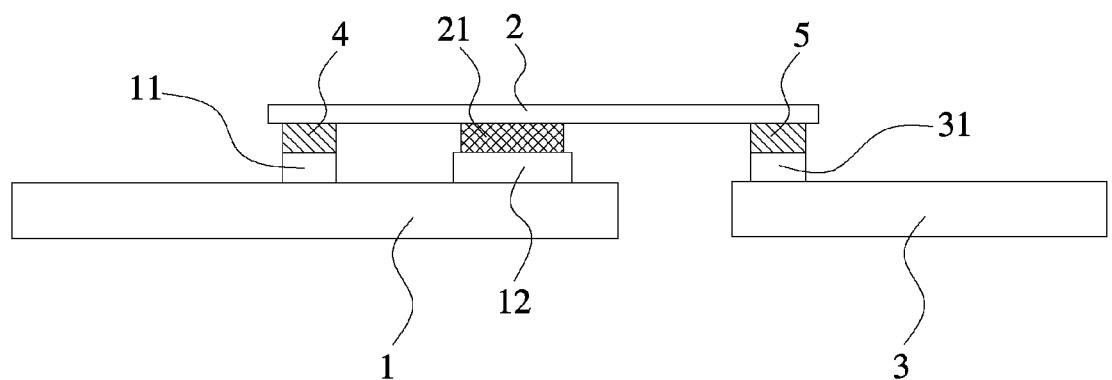
FIG. 4 is a schematic view of a display device according to another preferred embodiment of the present invention.

As shown in FIG. 3 and FIG. 4, for the purpose of increasing the resisting area which the bare copper region 12 and the chip 21 resist each other, and improving the heat-dissipating performance, in the embodiment, the dimension of the shadow which the bare copper region 12 projects on the plane where the chip 21 is positioned, is larger than or equal to the dimension of the shadow which the chip 21 projects on the plane where the bare copper region 12 is positioned. Such a configuration can make the chip 21 and the bare copper region 12 resist each other adequately, and thus achieving a better heat-dissipating performance. It would be understood that, it is also possible that, the dimension of the shadow which the bare copper region 12 projects on the plane where the chip 21 is positioned is smaller than the dimension of the shadow which the chip 21 projects on the plane where the bare copper region 12 is positioned, in case of ensuring that the bare copper region 12 and the chip 21 resist each other.

As shown in FIG. 3 and FIG. 4, according to the configuration of the above-mentioned circuit board, the present invention further provides a display device. The display device includes a circuit board 1 that has been mentioned above in any embodiment, a driver IC 2 and a display screen 3. The circuit board 1 is electrically connected to one side of the driver IC 2, and the driver IC 2 is fixed on the circuit board 1. The display screen 3 is electrically connected to the other side of the driver IC 2. With such connections, the display screen 3 can work normally.

In the present embodiment, the display screen 3 is an LCD display screen or an OLED display screen, and it includes a second golden finger 21 which is configured to make the display screen 3 electrically connected to the driver IC 2. The second golden finger 31 is positioned on one side of the display screen 3. It would be understood that, there are other options for the position of the second golden finger 31 relative to the display screen 3, for example, the second golden finger 31 can be positioned in the center of the display screen 3.

The display device further includes a first COF baseband 4 and a second COF baseband 5. COF, the full name of which is the chip on film in the typical display device, is generally configured to achieve the electrical connection between the driver IC 2 and the circuit board 1 or between the driver IC 2 and the display screen 3. The circuit board 1 is electrically connected to the driver IC 2 through the first COF baseband 4. The display screen 3 is electrically connected to the driver IC 2 through the second COP baseband 5. Specifically, a connection pin (not shown in figures) on one end of the first COF baseband 4 is electrically connected to the first golden finger 11 closely, and a connection pin (not shown in figures) on the other end of the first COF baseband 4 is electrically connected to one side of the driver IC 2 closely. A connection pin (not shown in figures) on one end of the second COF baseband 5 is electrically connected to one side of the second golden finger 31 closely, and a connection pin (not shown in figures) on the other end of the second COF baseband 5 is closely connected to the diver IC 2 on the side corresponding to the circuit board 1. By the use of the configuration of the first COF baseband 4 and the second COF baseband 5, the stability of the electrically connection among the circuit board 1, the driver IC 2, and the display screen 3 can be improved.

By implementing the circuit board and the display device provided in the above-mentioned embodiments, in which the circuit board 1 has a bare copper region 12 resisting the chip 21 of the driver IC 2, the heat generated from the driver IC 2 can be effectively conducted away, the heat-dissipating effect of the display device can be better, and thereby extending the lifetime of the display device mentioned above.

While various embodiments of the present invention have been described above referring to the accompanying drawings, it should be understood that they have been presented by way of example only, and not limitation. It will be apparent to persons skilled in the relevant art that various changes can be made therein in view of above teachings without departing from the scope defined in accordance with the purpose and claims of the present invention, and those various changes shall fall into the protection of the present invention.

The invention claimed is:

1. A circuit board for a display device, wherein the circuit board includes a bare copper region which is positioned corresponding to a chip of a driver IC of the display device; the bare copper region and the chip resist each other, and the bare copper region is configured to conduct away the heat generated from the chip; the bare copper region is disposed on one side of the circuit board which is close to a surface of the driver IC, the circuit board includes a first golden finger which is configured to make the circuit board electrically connected to the driver IC; the first golden finger is positioned in the centre of the circuit board, the bare copper region and the first golden finger are positioned on the same side of the circuit board, a dimension of a shadow which the bare copper region projects on a plane where the chip is positioned is larger than or equal to a dimension of a shadow which the chip projects on a plane where the bare copper region is positioned.

2. The circuit board according to claim 1, wherein the circuit board is an X-board PCB, the X-board PCB is positioned on the side in the longitudinal direction of the display screen of the display device.

3. A display device comprising a circuit board, a driver IC and a display screen; the driver IC is electrically connected to the circuit board and fixed on the circuit board, the display screen is electrically connected to the driver IC; the circuit board includes a bare copper region which is positioned corresponding to a chip of a driver IC of the display device; the bare copper region and the chip resist each other, and the bare copper region is configured to conduct away the heat generated from the chip; the bare copper region is disposed on one side of the circuit board which is close to a surface of the driver IC, the circuit board includes a first golden finger which is configured to make the circuit board electrically connected to the driver IC; the first golden finger is positioned in the centre of the circuit board, the bare copper region and the first golden finger are positioned on the same side of the circuit board, a dimension of a shadow which the bare copper region projects on a plane where the chip is positioned is larger than or equal to a dimension of a shadow which the chip projects on a plane where the bare copper region is positioned.

4. The display device according to claim 3, wherein the circuit board is an X-board PCB, the X-board PCB is positioned on the side in the longitudinal direction of the display screen of the display device.

5. The display device according to claim 3, wherein the display screen is an LCD display screen or an OLED display screen.

6. The display device according to claim 5, wherein the display screen includes a second golden finger which is configured to make the display screen electrically connected to the driver IC; the second golden finger is positioned on one side of the display screen.

7. The display device according to claim 3, wherein the display device further includes a first COF baseband; the circuit board is electrically connected to the driver IC through the first COF baseband.

8. The display device according to claim 3, wherein the display device further includes a second COF baseband; the display screen is electrically connected to the driver IC through the second COF baseband.

* * * * *